(12) United States Patent
Li et al.

(10) Patent No.: US 8,911,558 B2
(45) Date of Patent: Dec. 16, 2014

(54) POST-TUNGSTEN CMP CLEANING SOLUTION AND METHOD OF USING THE SAME

(75) Inventors: Hongqi Li, Boise, ID (US); Anurag Jindal, Boise, ID (US); Jin Lu, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 236 days.

(21) Appl. No.: 13/069,408

(22) Filed: Mar. 23, 2011

(65) Prior Publication Data

US 2012/0244705 A1     Sep. 27, 2012

(51) Int. Cl.
| | |
|---|---|
| *B08B 3/12* | (2006.01) |
| *B08B 6/00* | (2006.01) |
| *B08B 7/00* | (2006.01) |
| *B08B 7/02* | (2006.01) |
| *C25C 1/00* | (2006.01) |
| *C25F 3/30* | (2006.01) |
| *C25F 5/00* | (2006.01) |
| *C11D 11/00* | (2006.01) |
| *C11D 7/26* | (2006.01) |
| *H01L 21/02* | (2006.01) |

(52) U.S. Cl.
CPC ............ *C11D 11/0047* (2013.01); *C11D 7/265* (2013.01); *H01L 21/02074* (2013.01)

USPC ............ 134/1; 134/1.1; 134/1.2; 134/1.3; 252/79.1; 252/79.2; 252/79.4

(58) Field of Classification Search
None
See application file for complete search history.

(56) References Cited

U.S. PATENT DOCUMENTS

| | | | |
|---|---|---|---|
| 2004/0005787 A1* | 1/2004 | Day et al. ..................... | 438/745 |
| 2004/0009653 A1* | 1/2004 | Ueda et al. ................... | 438/622 |
| 2008/0004197 A1 | 1/2008 | Kneer | |
| 2009/0151755 A1* | 6/2009 | Beck .............................. | 134/42 |
| 2009/0215269 A1* | 8/2009 | Boggs et al. ................. | 438/693 |
| 2010/0075478 A1* | 3/2010 | Chang .......................... | 438/301 |

FOREIGN PATENT DOCUMENTS

| | | |
|---|---|---|
| CN | 1430262 A | 7/2003 |
| TW | 200813211 | 3/2008 |

* cited by examiner

*Primary Examiner* — Duy Deo
(74) *Attorney, Agent, or Firm* — Winston Hsu; Scott Margo

(57) ABSTRACT

A post-W CMP cleaning solution consists of carboxylic acid and deionized water. The carboxylic acid may be selected from the group consisting of (1) monocarboxylic acids; (2) dicarboxylic acids; (3) tricarboxylic acids; (4) polycarboxylic acids; (5) hydroxycarboxylic acids; (6) salts of the above-described carboxylic acids; and (7) any combination thereof. The post-W CMP cleaning solution can work well without adding any other chemical additives such as surfactants, corrosion inhibitors, pH adjusting agents or chelating agents.

7 Claims, 3 Drawing Sheets

POST-TUNGSTEN CMP CLEANING SOLUTION AND METHOD OF USING THE SAME

BACKGROUND OF THE INVENTION

1. Field of the Invention

The embodiments herein relate generally to the field of post chemical-mechanical polishing (post-CMP) cleaning operations. More specifically, the embodiments relate to a composition of cleaning solution employed in the post-tungsten CMP (post-W CMP) cleaning process.

2. Description of the Prior Art

Modern integrated circuit manufacturing relies on chemical mechanical polishing (CMP) processes to smooth the dielectric layers that are used between conducting metal layers as electrical insulation. The CMP technique is also widely used in a damascene type process to fabricate metal interconnects such as copper or tungsten lines, and metal plugs such as tungsten plugs that serve as electrical connectors between metal layers.

The CMP processes involve holding and rotating a thin, flat substrate including semiconductor material against a wetted polishing surface under controlled chemical, abrasives, pressure and temperature conditions. As the term is used herein, "semiconductor substrate" refers to any construction comprising the semiconductor material, including, but not limited to, bulk semiconductive materials, such as a semiconductive wafer, and semiconductive material layers (either alone or in assemblies comprising other materials). The polishing surface is generally a surface of a polish pad comprising a porous polymer, such as an elastomer, for example, polyurethane. A polishing slurry contains a polishing agent, such as alumina or silica, which is used as the abrasive material. In addition, the polishing slurry may contain selected chemicals which react with various surfaces of the substrate during processing. The combination of mechanical and chemical removal of material during polishing results in superior planarization of the surface.

The CMP processes, however, may leave contamination on the surfaces of the semiconductor substrate. This contamination may be comprised of abrasive particles from the polishing slurry, which may include alumina or silica, along with reactive chemicals added to the polishing slurry. In addition, the contamination may comprise reaction products of the polishing slurry and the polished surfaces. Small debris from the polishing pad also has a tendency to adhere to the surfaces of the semiconductor substrate during polishing. The contamination may be removed prior to subsequent processing of the semiconductor substrate in order to increase device reliability and to avoid the introduction of defects that reduce the manufacturing process yield. Thus, post-CMP cleaning solutions have been developed to clean the substrate surface of CMP residuum.

Often, after the tungsten CMP polish is completed, the resulting wafer has at least two distinct surfaces to be cleaned. For example, the majority of the wafer surface may be the dielectric cap surface, such as a silicon carbide surface or a silicon oxide surface, while the remainder may be the freshly polished surface of the tungsten plug or the interconnects. Both surfaces may be contaminated with residual slurry and/or polymer to be cleaned in the subsequent post-W CMP cleaning process. It is known to use a mixture of tetramethylammonium hydroxide (TMAH) and hydrofluoric acid (HF) in the post-W CMP cleaning process. However, such cleaning solution exhibits poor cleaning efficiency on the silicon carbide (SiCx) surface. The slurry residues and/or polymer residues, which can be identified by Real-time Defect Analysis (RDA), are frequently observed on the polished silicon carbide surface even after treatment by a known TMAH/HF mixture.

Therefore, advancements may be warranted in post-W CMP cleaning solutions to effectively remove the slurry residues and/or polymer residues from the silicon carbide surface or any polished dielectric surface having surface characteristics similar to the silicon carbide surface.

SUMMARY OF THE INVENTION

In an embodiment, a post-tungsten CMP cleaning method includes performing a tungsten CMP process to produce a wafer surface having a dielectric surface and a tungsten surface. Abrasive and/or polymer particles from the CMP process remain on the wafer surface. The method includes removing the abrasive and/or polymer particles using a cleaning solution consisting of carboxylic acid and water.

Another embodiment provides a post-tungsten CMP cleaning solution, consisting of carboxylic acid; and the remainder being substantially deionized water. The carboxylic acid may be selected from the group consisting of (1) monocarboxylic acids; (2) dicarboxylic acids; (3) tricarboxylic acids; (4) polycarboxylic acids; (5) hydroxycarboxylic acids; (6) salts of the above-described carboxylic acids; and (7) any combination thereof. The post-W CMP cleaning solution can work well without adding any other chemical additives such as surfactants, corrosion inhibitors, pH adjusting agents or chelating agents. Therefore, the preparation of the post-W CMP cleaning solution according to this embodiment is very simple and cost-effective.

In another embodiment, a post-tungsten CMP cleaning method includes: (1) performing a tungsten CMP process to produce a wafer surface having at least an exposed silicon carbide surface and a tungsten surface; (2) wetting the silicon carbide surface with a cleaning solution consisting of carboxylic acid and water; (3) flushing and/or scrubbing the silicon carbide surface with the cleaning solution or deionized water; and (4) drying the wafer surface. By wetting the exposed silicon carbide surface with the cleaning solution consisting of carboxylic acid and water, a suspended film may be formed over the wafer surface. The suspended film may be an aqueous thin film contacting the wafer surface and containing suspended polymer particles or substances. One or more individual particles of the suspended polymer particles may be enveloped by the carboxylic acid to form a micelle-like structure in the cleaning solution.

In a further embodiment, a post-tungsten CMP cleaning method includes: (1) performing a tungsten CMP process to produce a wafer surface having at least a hydrophobic surface and a tungsten surface; and (2) wetting the hydrophobic surface with a cleaning solution consisting of organic acid and water, thereby changing the hydrophobic surface into a hydrophilic surface. The hydrophobic surface may include a silicon carbide surface, a silicon nitride surface or a carbon surface. The organic acid may generate —COOH and/or —COO⁻ after being hydrolyzed in aqueous solution. The organic acid may be carboxylic acid.

Those of ordinary skill in the art may appreciate these and other embodiments after reading the following detailed description of the embodiments that are illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1A:
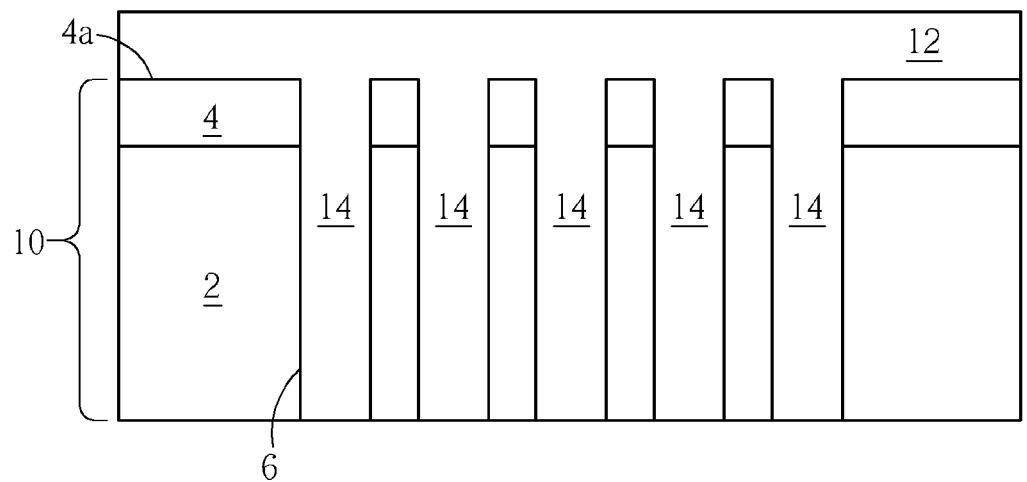
FIGS. 1A and 1B are cross-sectional views of intermediate structures showing a portion of an integrated circuit (IC) chip during the fabrication of tungsten plugs.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Figure 1B:
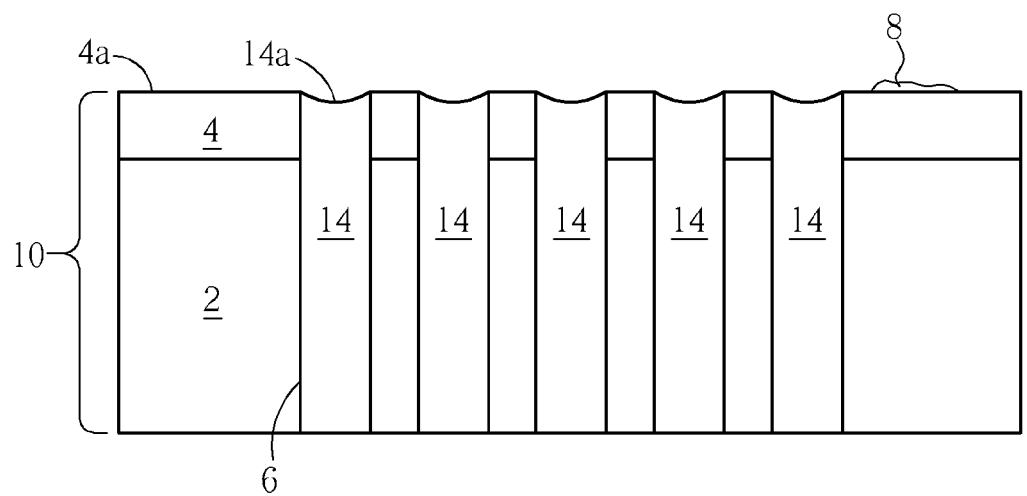

FIGS. 1A and 1B are cross-sectional views of intermediate structures showing a portion of an integrated circuit (IC) chip during the fabrication of tungsten plugs. As shown in FIG. 1A, openings 6 are etched into a dielectric film stack 10 on a wafer substrate (not shown) using a known lithographic process and dry etching process. Openings 6 may be contact holes. Dielectric film stack 10 may comprise a silicon oxide layer 2 and a silicon carbide cap layer 4. For example, silicon oxide layer 2 may be produced from tetraethylorthosilicate (TEOS oxide) or contain borophosphosilicate glass (BPSG). Silicon carbide cap layer 4 may act as a CMP stop layer during isolation of the tungsten plugs. Silicon carbide cap layer 4 might also act as an etch stop layer for the next level dry etch. Often, silicon carbide cap layer 4 is deposited onto silicon oxide layer 2 and has a thickness of about 100-3000 angstroms prior to the dry etching of openings 6 (contact holes).

After the formation of openings 6 (contact holes), tungsten film 12 is deposited to fill openings 6 (contact holes) thereby forming structures 14. In the case where openings 6 are contact holes, structures 14 may be tungsten plugs. Tungsten film 12 also covers a top surface 4a of silicon carbide cap layer 4. To isolate structures 14 (tungsten plugs), tungsten CMP (WCMP) is then carried out and tungsten film 12 overlying top surface 4a of silicon carbide cap layer 4 is removed. After the tungsten CMP is completed, top surface 4a of silicon carbide cap layer 4 is exposed. At this point, slurry residues and/or polymer residues 8 may be present on top surface 4a and the polished wafer is subject to post CMP cleaning.

It is to be understood that the intermediate structures in FIGS. 1A and 1B are for illustration purposes and are not meant to be any limitation of the embodiment. For example, in another case, dielectric film stack 10 may comprise other dielectric capping materials such as silicon nitride or carbon. Dielectric film 2 might be a silicon carbide layer too.

In another embodiment, structures 14 in FIGS. 1A and 1B can be tungsten interconnect lines. FIGS. 1A and 1B can also be understood as cross-sectional views of intermediate structures showing a portion of an integrated circuit (IC) chip during the fabrication of tungsten interconnects. For example, as shown in FIG. 1A, openings 6 may be interconnect trenches that are etched into the dielectric film stack 10 on a wafer substrate (not shown) using a known lithographic process and a dry etching process. Dielectric film stack 10 may comprise silicon oxide layer 2 and silicon carbide cap layer 4. For example, silicon oxide layer 2 may be TEOS oxide or BPSG. Silicon carbide cap layer 4 may act as a CMP stop layer during isolation of the tungsten interconnects. Silicon carbide cap layer 4 might also act as an etch stop layer for next level dry etch. Often, silicon carbide cap layer 4 is deposited onto silicon oxide layer 2 and has a thickness of about 100-3000 angstroms prior to the dry etching of openings 6 (interconnect trenches).

After the formation of openings 6 (interconnect trenches), tungsten film 12 is deposited to fill openings 6, thereby forming structures 14 (tungsten interconnect lines). Tungsten film 12 also covers top surface 4a of silicon carbide cap layer 4. To isolate the tungsten interconnects, tungsten CMP is then carried out and tungsten film 12 overlying top surface 4a of silicon carbide cap layer 4 is removed. After the tungsten CMP is completed, top surface 4a of silicon carbide cap layer 4 is exposed. At this point, slurry residues or polymer residue 8 may be present on the top surface 4a and the polished wafer is subject to post CMP cleaning.

As previously mentioned, the known post-W CMP cleaning solution containing mixture of tetramethylammonium hydroxide (TMAH) and hydrofluoric acid (HF) cannot effectively remove the slurry residues or polymer residues from the silicon carbide surface or any polished dielectric surface having surface characteristics that are similar to the silicon carbide surface. Generally, after WCMP, a scrubber that scrubs a wafer on both sides may be used to remove wafer contaminants. The type of cleaning solution used in the scrubber may depend upon the type of contaminants to be removed, the type of wafer to be scrubbed, and/or the manufacturer's recommended method for cleaning.

TMAH and HF are known cleaning chemicals for post WCMP cleaning. For the known WCMP, SiOx layer (BPSG or TEOS) and W layer are exposed after WCMP. In aqueous solution, the SiOx surface is generally terminated with Si—OH and Si—O$^-$ groups as a result of silicon dioxide hydrolysis, dependent on the pH in bulk solution. Si—OH and Si—O$^-$ groups make the wafer surface hydrophilic and wettable to some extent, depending on the deposition condition of SiOx layer. If the pH is higher (basic), just like in a TMAH aqueous solution, more negative electrostatic charges can accumulate on the SiOx surface, making the wafer surface with the capability of pushing away the silica particles. Silica particles, the major component in WCMP slurry, are the most frequent CMP contaminants remaining on the wafer after polishing.

Figure 2:
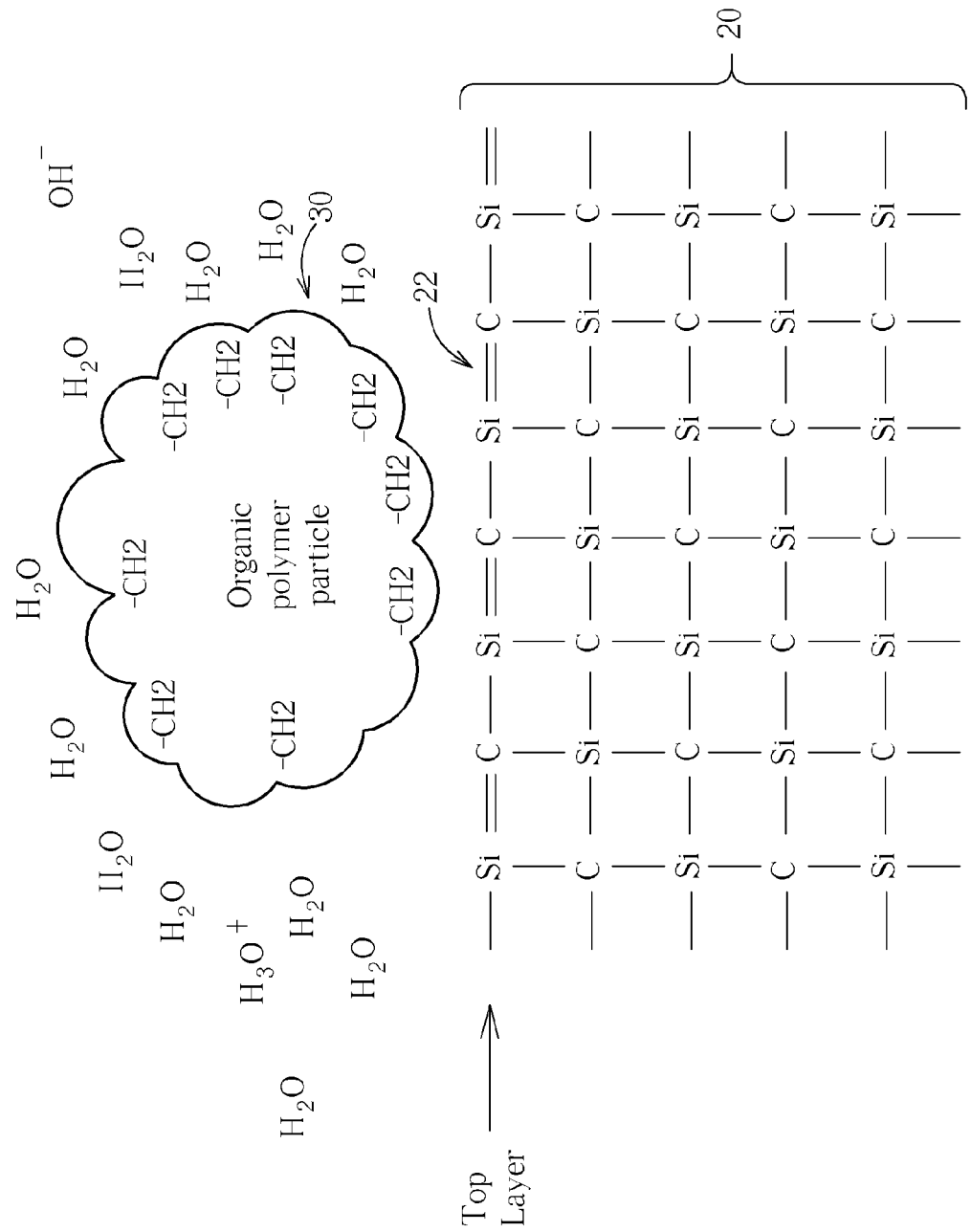
FIG. 2. is a schematic diagram showing the hydrophobic silicon carbide surface adsorbing polymer particles.

However, silicon carbide or SiCx, with a structure like diamond, is highly non-polar in nature and highly hydrophobic, as shown in FIG. 2. Without being limited to any theory, the unsaturated carbon-silicon bonds 22 in the surface layer of the silicon carbide film 20 might act as sites for adsorbing contaminants. For example, polymer particles 30 originating from the brush material or the polishing pad material may have some hydrophobic structures showing affinity to the SiCx surface. The hydrolysis of SiCx is negligible in aqueous solution and, therefore, the hydrophobic surface does not wet sufficiently to remove slurry particles. As a result, some slurry particles and polymer particles may remain, adhering to the wafer surface.

Cleaning surface contaminants would be unsuccessful by the known post-W CMP cleaning because neither HF nor TMAH can change the SiCx surface from hydrophobic to hydrophilic. To increase cleaning efficiency after WCMP for removing polymer particles and slurry residues from the SiCx surface, observation indicated that changing the wafer surface from hydrophobic to hydrophilic is effective.

With that in mind, the embodiments provide a wafer surface cleaning solution comprised of organic acids, which can effectively change the wafer surface from hydrophobic to hydrophilic. In one embodiment, the organic acids may be generally expressed by the formula: R(COOH)n, wherein R represents a hydrocarbon group and n is an integer. The carboxylic group (—COOH) is hydrophilic and provides negative charge (carboxylate ion) upon hydrolysis. The hydrocarbon group (R), which may contain unsaturated bonds, may have an affinity to adsorb onto a hydrophobic surface, such as the silicon carbide surface, via intermolecular force.

When organic acids anchor onto the SiCx surface, the wafer surface may become a hydrophilic surface with some negative charges thereon, which are prone to push away the silica slurry particles since they may also be negatively charged and hydrophilic. On the other hand, the organic acids may envelope the polymer particles to form micelle-like structures, making the polymer particles more hydrophilic and more negatively charged and distributing the polymer particles in the cleaning solution. Therefore, adhesion between the SiCx surface and the polymer particles or slurry particles may be weakened or eliminated, making removal of the polymer or slurry particles easier.

Figure 3:
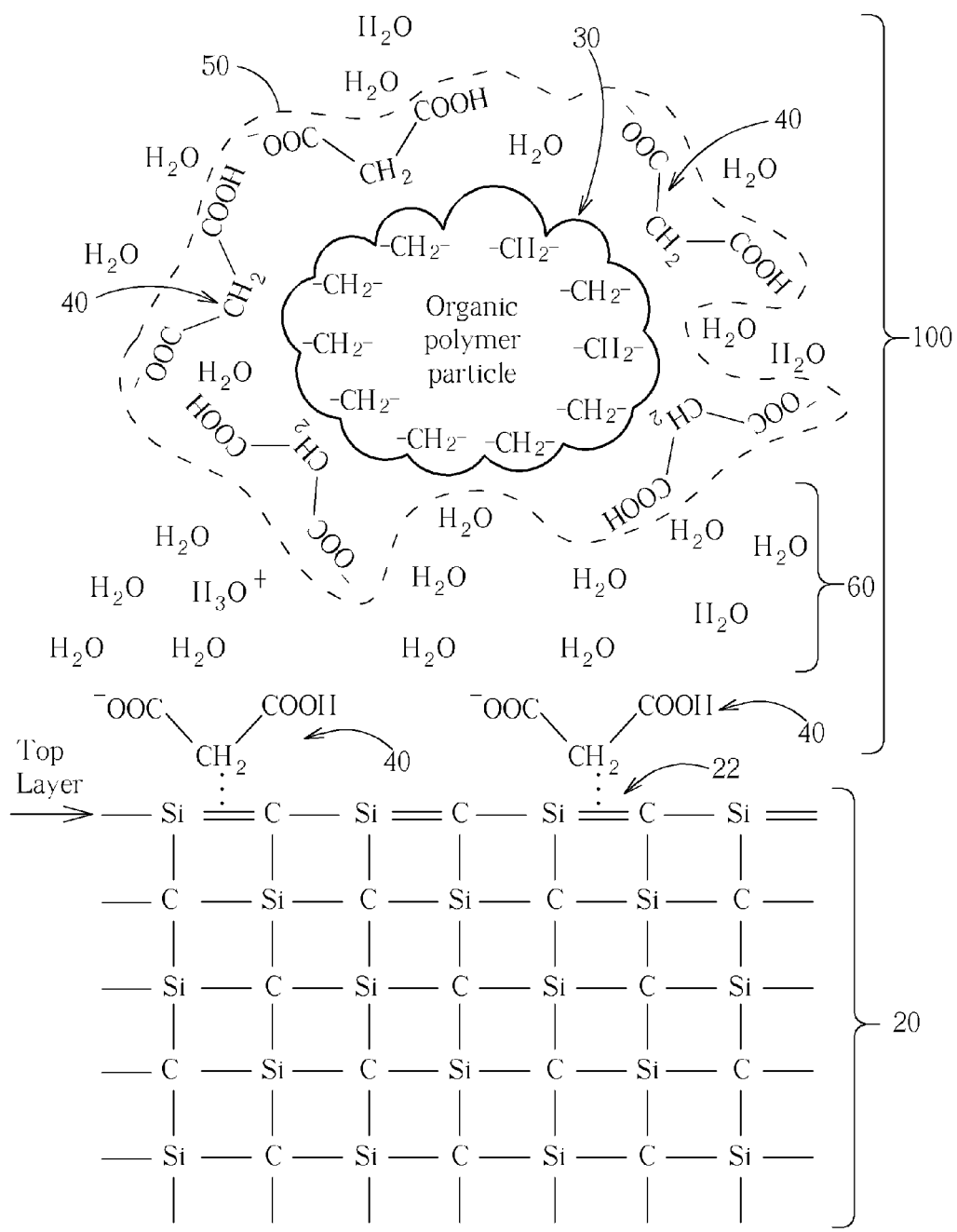
FIG. 3 is a schematic diagram showing the simplified cleaning mechanism in accordance to one embodiment.

FIG. 3 is a schematic diagram showing the simplified cleaning mechanism in accordance to one embodiment, wherein dicarboxylic acid solution is employed. As shown in FIG. 3, a dicarboxylic acid 40 such as malonic acid $CH_2(COOH)_2$ adsorbs onto the hydrophobic silicon carbide surface via intermolecular force. The two carboxylic groups of each malonic acid may provide one or two negative charges upon releasing proton(s) into the bulk solution, thereby modifying the wafer surface from hydrophobic to hydrophilic surface. Polymer particle 30, which may originate from the brush material or the polishing pad material, is enveloped by the malonic acid molecules to form a micelle-like structure 50 in a cleaning solution 100. Polymer particle 30 thereby becomes more hydrophilic and more negatively charged, repelling the negative charged silicon carbide surface. In addition, the negatively charged micelle-like structure 50 may be separated by a water layer 60 from the negative charged silicon carbide surface, such that polymer particle 30 becomes suspended and can be readily washed away via scrubbing, flushing or rinsing. It is to be understood that the cleaning mechanism depicted in FIG. 3 is for illustration purposes and is not meant to limit the embodiments.

According to the embodiment, the term "carboxylic acid" may comprise: (1) monocarboxylic acids such as benzoic acid or acrylic acid; (2) dicarboxylic acids such as oxalic acid, malonic acid $CH_2(COOH)_2$, succinic acid $(CH_2)_2(COOH)_2$, glutaric acid $(CH_2)_3(COOH)_2$, adipic acid $(CH_2)_4(COOH)_2$, maleic acid $HO_2CCH\!=\!CHCO_2H$, or fumaric acid $HO_2CCH\!=\!CHCO_2H$; (3) tricarboxylic acids such as citric acid; (4) polycarboxylic acids such as polyacrylic acid; (5) hydroxycarboxylic acids such as citric acid; (6) salts of the above-described carboxylic acids; and (7) any combination thereof. Observation indicated that benzoic acid and acrylic acid were more effective when compared to the other monocarboxylic acid like formic acid HCOOH, acetic acid or lactic acid $C_3H_6O_3$, which have shorter hydrocarbon chains and/or lack unsaturated bonds. Observation also indicated that polyacrylic acid was an effective cleaning chemical, containing multiple —COOH/COO⁻ groups when dissolved in water.

The unsaturated hydrocarbon structures of benzoic acid, maleic acid, and acrylic acid may help anchor the carboxylic acid molecule onto the hydrophobic surface, with the —COOH/COO⁻ groups extend outward from the surface. Generally, the carboxylic acid containing more than one —COOH/COO⁻ group after being dissolved in water may be most effective, because —COOH can help make the wafer surface more hydrophilic. According to one embodiment, oxalic acid, citric acid, polyacrylic acid, benzoic acid, maleic acid, and acrylic acid are the most effective candidates in terms of their cost and performance. The above-mentioned carboxylic acids can be used separately or may be used in combination.

Another technical feature of the embodiments is that the post-W CMP cleaning solution may contain only deionized (DI) water and carboxylic acid, which means that the post-W CMP cleaning solution can work well without the need of adding any other chemical additives such as surfactants, corrosion inhibitors, pH adjusting agents or chelating agents. For example, the carboxylic acid itself can function as a chelating agent, which removes metal contamination. In addition, tungsten is safe in the post-W CMP cleaning solution of the embodiments due to its Pourbaix behavior, producing a static etch rate of tungsten that is very slow in such acidic solution. Therefore, the preparation of the post-W CMP cleaning solution according to the embodiments is very simple and cost-effective.

The following non-limiting examples are presented to further illustrate the embodiments.

Hypothetical Example 1

A concentration comprising about 0.4% by weight of polyacrylic acid and about 99.6% of deionized water can be prepared. The average molecular weight of polyacrylic acid can be about 2000. No need exists to adjust pH additionally. The concentration of carboxylic acid can be 0.01% to 3% by weight, with the consideration of cost and performance. This liquid can be applied onto the SiCx surface of a wafer, both front side and back side, while the wafer is scrubbed for 20 seconds inside the polisher cleaning module. The liquid can additionally rinse over the wafer surface for a certain time. After being thoroughly rinsed by DI water to remove the cleaning chemical, the wafer can be dried in a known manner.

Hypothetical Example 2

A concentration comprising about 0.2% by weight of acrylic acid and about 99.8% of deionized water can be prepared. No need exists to adjust pH additionally. The concentration of carboxylic acid can be 0.01% to 3% by weight, with the consideration of cost and performance. The cleaning method can be similar to Hypothetical Example 1 mentioned above.

Hypothetical Example 3

A concentration comprising about 0.3% by weight of benzoic acid and about 99.7% of deionized water can be prepared. No need exists to adjust pH additionally. The concentration of carboxylic acid can be 0.01% to 3% by weight, with the consideration of cost and performance. The cleaning method can be similar to the examples mentioned above.

Hypothetical Example 4

A concentration comprising about 0.1% by weight of oxalic acid mixed with about 99.9% of deionized water can be prepared. No need exists to adjust pH additionally. The concentration of carboxylic acid can be 0.01% to 3% by weight, with the consideration of cost and performance. The cleaning method can be similar to the examples mentioned above.

Hypothetical Example 5

A concentration comprising about 0.2% by weight of maleic acid and about 99.8% of deionized water can be prepared. No need exists to define pH range. The concentration of carboxylic acid can be 0.01% to 3% by weight, with the consideration of cost and performance. The cleaning method can be similar to the examples mentioned above.

Hypothetical Example 6

A concentration comprising about 0.3% by weight of citric acid and 99.7% of deionized water can be prepared. No need exists to define pH range. The concentration of carboxylic acid can be 0.01% to 3% by weight, with the consideration of cost and performance. The cleaning method can be similar to the examples mentioned above.

In one embodiment, a post-W CMP cleaning method includes:
(1) performing a tungsten CMP process to produce a wafer having thereon at least an exposed silicon carbide surface and an exposed tungsten surface;
(2) rinsing the wafer in DI water;
(3) wetting the exposed silicon carbide surface with a cleaning solution comprising at least carboxylic acid to thereby form a suspended film (i.e., an aqueous thin film containing suspended polymer particles or substances) over the wafer surface, which may be performed via scrubbing or rinsing;
(4) flushing and/or scrubbing the exposed silicon carbide surface with the cleaning solution or DI water (in order to remove or "replace" the suspended film);
(5) rinsing the wafer in DI water again; and
(6) drying the wafer.

It is noteworthy that the above-described process or method may be performed in a known polisher or post-CMP cleaning module. The above-described process or method may be applied on a standalone wet process tool after a normal W-CMP process with normal on-tool clean. In one embodiment, the first rinsing in DI water may be omitted. Also, the wetting with cleaning solution and/or the flushing and/or scrubbing may be combined or only one of them be employed. Further, the above-described process or method may be performed in combination with a megasonic cleaning process.

It is to be understood that the embodiments are capable of use in various other combinations, modifications, and environments and is capable of changes or modifications within the concepts expressed herein. For example, the chemicals used may generate —COOH or —COO⁻ after they are hydrolyzed in aqueous solution. For example, $R_1COOR_2$ or $R_1COOOR_2$ can be employed in the same way. Moreover, although the silicon carbide surface is employed in the described embodiments for illustration purposes, it is to be understood that the post-W CMP cleaning solution of the embodiments is also applicable to the surface cleaning of other hydrophobic materials or films such as silicon nitride, carbon-containing film or carbon-based dielectric.

Those skilled in the art will readily observe that numerous modifications and alterations of the device and method may be made while retaining the teachings of the embodiments.

What is claimed is:

1. A post-tungsten CMP cleaning method for cleaning a wafer surface having at least an exposed silicon carbide surface and a tungsten surface, comprising:
    loading the wafer having at least an exposed silicon carbide surface and a tungsten surface into a scrubber;
    wetting the silicon carbide surface with a cleaning solution consisting of carboxylic acid and water within the scrubber;
    after wetting the silicon carbide surface with the cleaning solution, successively flushing and/or scrubbing the silicon carbide surface with the cleaning solution or deionized (DI) water; and
    after flushing and/or scrubbing the silicon carbide surface with the cleaning solution or DI water, successively drying the wafer surface.

2. The post-tungsten CMP cleaning method according to claim 1 wherein by wetting the exposed silicon carbide surface with the cleaning solution consisting of carboxylic acid and water, a suspended film is formed over the wafer surface.

3. The post-tungsten CMP cleaning method according to claim 2 wherein the exposed silicon carbide surface is wetted via scrubbing or rinsing.

4. The post-tungsten CMP cleaning method according to claim 2 wherein the suspended film is an aqueous thin film contacting the wafer surface and containing suspended polymer particles or substances.

5. The post-tungsten CMP cleaning method according to claim 4 wherein one or more individual particles of the suspended polymer particles are enveloped by the carboxylic acid to form a micelle-like structure in the cleaning solution.

6. The post-tungsten CMP cleaning method according to claim 2 wherein the flushing and/or scrubbing the exposed silicon carbide surface with the cleaning solution removes or replaces the suspended film.

7. The post-tungsten CMP cleaning method according to claim 1 wherein the exposed silicon carbide surface is modified from a hydrophobic to a hydrophilic surface with some negative charges thereon by the wetting of the exposed silicon carbide surface with the cleaning solution consisting of carboxylic acid and water.

* * * * *